US012795808B2

(12) United States Patent
Plach

(10) Patent No.: US 12,795,808 B2
(45) Date of Patent: Nov. 10, 2026

(54) ELECTRONIC DEVICE WITH A CIRCUIT ASSEMBLY WITH THERMALLY CONDUCTIVE CONTACTS WITH RECESS TO RECEIVE A PORTION OF A FLEXIBLE HOSE

(71) Applicant: Continental Automotive Technologies GmbH, Hannover (DE)

(72) Inventor: Andreas Plach, Forchheim (DE)

(73) Assignee: AUMOVIO Germany GmbH, Frankfurt am Main (DE)

( * ) Notice: Subject to any disclaimer, the term of this patent is extended or adjusted under 35 U.S.C. 154(b) by 267 days.

(21) Appl. No.: 18/686,218

(22) PCT Filed: Jul. 13, 2022

(86) PCT No.: PCT/DE2022/200156

§ 371 (c)(1),
(2) Date: Feb. 23, 2024

(87) PCT Pub. No.: WO2023/025356

PCT Pub. Date: Mar. 2, 2023

(65) Prior Publication Data

US 2025/0261297 A1 Aug. 14, 2025

(30) Foreign Application Priority Data

Aug. 25, 2021 (DE) ..................... 10 2021 209 330.2

(51) Int. Cl.
*H05K 1/02* (2006.01)
*H05K 5/00* (2025.01)
(Continued)

(52) U.S. Cl.
CPC ......... *H05K 1/0203* (2013.01); *H05K 5/0026* (2013.01); *H05K 7/20254* (2013.01);
(Continued)

(58) Field of Classification Search
CPC ............... H05K 1/0203; H05K 5/0026; H05K 2201/064; H05K 2201/066;
(Continued)

(56) References Cited

U.S. PATENT DOCUMENTS 4,447,842 A 5/1984 Berg
6,651,732 B2 11/2003 Sagal
(Continued)

FOREIGN PATENT DOCUMENTS

DE 9209878 U1 10/1992
DE 202010014106 U1 12/2010
(Continued)

OTHER PUBLICATIONS

Office Action dated May 17, 2022 from corresponding German patent application No. 10 2021 209 330.2.
(Continued)

*Primary Examiner* — Jayprakash N Gandhi
*Assistant Examiner* — Steven Ngo

(57) ABSTRACT

An electronic device comprises a circuit arrangement having a circuit board with a heat-generating semiconductor component, and a thermally conductive plate as a heat sink configured to be in thermally conductive contact with a cooling element. A recess provided in the thermally conductive plate in the region of a connecting surface, for connecting to the cooling element, is configured to receive a part of a flexible hose. A housing with at least two receiving rails for receiving the circuit arrangement, is formed with a cooling element arranged between the two receiving rails such that contact is made between the connecting surface of the thermally conductive plate and the cooling element when the circuit arrangement is fully inserted into the housing between the receiving rails, wherein the cooling element has, in the region of a connect-
(Continued)

ing surface, a recess in which at least a part of the flexible hose is arranged.

18 Claims, 2 Drawing Sheets

(51) Int. Cl.

| | |
|---|---|
| ***H05K 7/20*** | (2006.01) |
| ***H10W 40/20*** | (2026.01) |
| ***H10W 40/47*** | (2026.01) |

(52) U.S. Cl.
CPC ......... *H05K 7/205* (2013.01); *H05K 7/20509* (2013.01); *H05K 7/20627* (2013.01); *H10W 40/231* (2026.01); *H10W 40/47* (2026.01); *H05K 2201/064* (2013.01); *H05K 2201/066* (2013.01)

(58) Field of Classification Search
CPC ........... H05K 7/20254; H05K 7/20272; H05K 7/20327; H05K 7/20336; H05K 7/20436; H05K 7/205; H05K 7/20509; H05K 7/20627; H05K 7/20854; H05K 7/20872; H05K 7/20881; H05K 7/209; H05K 7/20927; H05K 7/20936; H10W 40/231; H10W 40/47
See application file for complete search history.

(56) References Cited

U.S. PATENT DOCUMENTS

| | | | | |
|---|---|---|---|---|
| 8,767,403 | B2 * | 7/2014 | Rau | H10W 40/47<br>361/721 |
| 9,521,782 | B2 * | 12/2016 | Tatta | H05K 7/20409 |
| 9,713,287 | B2 * | 7/2017 | Wong | H05K 7/20545 |
| 2009/0161312 | A1 | 6/2009 | Spearing et al. | |
| 2009/0277616 | A1 * | 11/2009 | Cipolla | F28D 15/0233<br>165/104.33 |
| 2012/0085520 | A1 | 4/2012 | Pfaffinger | |
| 2016/0048179 | A1 | 2/2016 | Watanabe | |
| 2020/0159294 | A1 * | 5/2020 | Franz | G06F 1/20 |
| 2020/0315062 | A1 | 10/2020 | Leigh et al. | |

FOREIGN PATENT DOCUMENTS

| | | | |
|---|---|---|---|
| DE | 202013002411 | U1 | 6/2013 |
| EP | 3515159 | A1 | 7/2019 |

OTHER PUBLICATIONS

International Search Report and Written Opinion dated Oct. 18, 2022 from corresponding International patent application No. PCT/DE2022/200156.

* cited by examiner

ELECTRONIC DEVICE WITH A CIRCUIT ASSEMBLY WITH THERMALLY CONDUCTIVE CONTACTS WITH RECESS TO RECEIVE A PORTION OF A FLEXIBLE HOSE

The invention relates to an electronic device that has a circuit arrangement having a circuit board with at least one heat-generating semiconductor component arranged thereon, and having a thermally conductive plate which serves as a heat sink, is in thermally conductive contact with the at least one semiconductor component and is arranged parallel to the circuit board, wherein the thermally conductive plate is designed to be placed in thermally conductive contact with a cooling element.

Such a circuit arrangement is known from DE 20 2013 002 411 U1. FIG. 4 of said document shows a corresponding circuit arrangement, which is described in detail in the associated description. A heat-generating semiconductor component is shown, which may be installed on a circuit board. Such a heat-generating semiconductor component may for example be a microprocessor or a power transistor or any semiconductor component that generates large heat losses. It is therefore necessary to provide heat-dissipating means that allow reliable dissipation of heat from the semiconductor component.

For this purpose, a thermally conductive plate is provided which serves as a heat sink and which is arranged on that side of the semiconductor component which is situated opposite the circuit board, said thermally conductive plate being in thermally conductive contact with the semiconductor component. A thermally conductive paste or a thermally conductive adhesive or the like may be provided between the semiconductor component and the thermally conductive plate, in particular in order to compensate for unevennesses of the two surfaces.

A cooling element is arranged on the thermally conductive plate, wherein a thermally conductive paste may also be arranged here between the thermally conductive plate and the cooling element.

To allow the best possible heat dissipation, intimate contact must be established between the installed components, which is commonly achieved by applying a defined force with which the components are pressed against one another. In the case of the known design, however, said force must not be excessively high, because the semiconductor component and its connection to the circuit board do not tolerate the application of high force.

In particular if the circuit arrangement is installed into a housing designed as a so-called rack, where the circuit arrangement is inserted into the housing by means of guide rails in order for electrical contact to be established at the rear wall of the housing, it is not so easily possible to apply the required force. Here, it is also not so easily possible to provide a cooling element which is cooled using cooling medium and which runs parallel to the circuit board.

DE 92 09 878 U1 discloses a circuit arrangement having a circuit board with at least one heat-generating semiconductor component arranged thereon, and having a thermally conductive plate which serves as a heat sink, is in thermally conductive contact with the at least one semiconductor component and is arranged perpendicular to the circuit board, wherein the thermally conductive plate can be placed in thermally conductive contact with a cooling element, and wherein a recess is provided in the thermally conductive plate in the region of a connecting surface, provided for connecting to a cooling element, of the thermally conductive plate, in which recess a flexible hose extends. Here, the recess is designed such that an outer wall of the hose is aligned with the surface of the cooling element.

DE 20 2010 014 106 U1 discloses a heat distributor for dissipating heat that is generated by at least one heat-generating power semiconductor component. In particular, heat distributors are disclosed which exhibit not only improved thermal coupling between a chip and a cooling element but also a flexible coupling arrangement that can compensate tolerances of the components and of the assembly process. Here, the heat distributor comprises a base plate which is thermally conductively connectable to the at least one power semiconductor component and which has at least one recess in which at least one heat pipe for dissipating the generated heat is arranged, wherein the at least one heat pipe is supported movably in the recess.

U.S. Pat. No. 6,651,732 B2 has described a composite heat dissipation assembly having a thermally conductive elastomer cooling element injection-molded into net shape and having at least one integrated heat pipe. The flexible cooling element formed there consists of an elastomer base material that is laden with thermally conductive filler material. The base material is mixed with the filler material and the net shape in order to form the outer geometry of the assembly. Formed within the geometry of the part is an integral channel that is capable of receiving a heat pipe. The channel is shaped so as to have an opening that is somewhat smaller than the outer cross-sectional dimensions of the heat pipe. When the heat pipe is pushed into the channel, a proportion of the elastomer material is compressed, and the reaction force of the compressed material pushes the elastomer firmly into thermal contact with the outer surface of the heat pipe. Furthermore, the manner in which the elastomer connects to the surface of the heat pipe reduces the contact resistance between the surface of the heat pipe and the outer component, thus eliminating the need to use adhesive or a conforming thermal interface for installing the part.

It is the object of the invention to specify a solution with which good cooling of the one or more semiconductor components is possible in particular in the case of the circuit arrangement being installed in a housing with guide or receiving rails.

The object is achieved by means of an electronic device that has a circuit arrangement having a circuit board with at least one heat-generating semiconductor component arranged thereon, and having a thermally conductive plate which serves as a heat sink, is in thermally conductive contact with the at least one semiconductor component and is arranged parallel to the circuit board, wherein the thermally conductive plate is designed to be placed in thermally conductive contact with a cooling element, and wherein at least one recess is provided in the thermally conductive plate in the region of a connecting surface, provided for connecting to the cooling element, of the thermally conductive plate, said recess being designed to receive a part of a flexible hose.

The electronic device furthermore has the following:

a housing which has at least two receiving rails for receiving the circuit arrangement, a contact apparatus for making contact with a counterpart contact apparatus which is arranged on the circuit board of the circuit arrangement, wherein the contact apparatus is arranged between the receiving rails such that the contact is made when the circuit arrangement is fully inserted into the housing between the receiving rails, and a cooling element which is arranged between the two receiving rails such that contact is made between the connecting surface of the thermally conductive plate and the cooling element when the circuit arrangement is fully inserted into the housing between the receiving rails, wherein the cooling element has, in the region of a connecting surface, at least one recess in which at least a part of the flexible hose is arranged.

This advantageously results in contact both of the thermally conductive plate and of the cooling element with the flexible hose, through which a cooling liquid can flow and which is pressed against the walls of the two recesses under the pressure of said cooling liquid. Here, suitable measures should be implemented to ensure that the thermally conductive plate, when inserted into the housing, is pushed against the cooling element and fixed, which is possible without problems in the manner described above, such that the expansion of the flexible hose does not cause the thermally conductive plate and the cooling element to be pushed apart again.

Both the thermally conductive plate and the cooling element have at least one recess, which recesses, when the circuit arrangement has been inserted into the housing that has the cooling element, form a channel in which the flexible hose is situated, which flexible hose is pushed against the walls of the recesses of the thermally conductive plate and of the cooling element by a cooling fluid, preferably a cooling liquid, and, if the material of said flexible hose has a suitable coefficient of thermal conductivity, allows good heat transport from the thermally conductive plate to the cooling element.

It is preferable for multiple recesses which form such channels to be provided in the thermally conductive plate and in the cooling element.

The at least one recess preferably extends from one side of the circuit arrangement to the opposite side. This applies to the thermally conductive plate and to the cooling element. In this way, the largest possible contact area can be utilized for heat transfer.

In one advantageous embodiment, the at least one recess is semicircular. In this way, the flexible hose can expand, and be pushed against the walls of the recesses, in an ideal manner.

In an alternative embodiment, the at least one recess in the thermally conductive plate is designed as a channel, the mean diameter of which is larger than an opening of the channel, said opening being situated in the connecting surface.

In this way, a non-expanded hose on the cooling plate during the installation of the circuit arrangement into a housing can, upon expansion when filled with cooling fluid, deflect through said opening into the channel in the thermally conductive plate, firstly allowing good heat transfer and secondly allowing the thermally conductive plate to be fixed to the cooling element.

The cross section of the channel is advantageously circular.

In the circuit arrangement, it is advantageously the case that the direction in which the semiconductor component is connected to the thermally conductive plate is oriented perpendicular to the direction in which the thermally conductive plate is connected to the cooling element, wherein a connecting surface, provided for connecting to the cooling element, of the thermally conductive plate is oriented perpendicular to the surface of the circuit board.

It is thus possible for the thermally conductive plate to be oriented with its longitudinal direction in a direction of insertion into a housing, and for good dissipation of heat to the cooling element in the housing to nevertheless be allowed, because the thermally conductive plate can thus be pressed with a greater force against the cooling element without the risk of damaging the components on the circuit board.

In order to allow heat transfer from the thermally conductive plate to the cooling element even in regions where no hoses extend, the connecting surface of the cooling element and the connecting surface of the thermally conductive plate should have a congruent profile. Said connecting surfaces can thus be placed in intimate contact and allow good heat transfer.

In order to allow guided insertion of the circuit arrangement into the electronic device, the receiving rails may have grooves and the thermally conductive plate may have, on opposite side walls, projections matching the grooves, or vice versa.

The circuit arrangement can thus be easily inserted into the electronic device.

In one advantageous embodiment of the electronic device, it is also possible for the receiving rails to have grooves in which a flexible hose is fastened, and for the thermally conductive plate to have, on opposite side walls, recesses which are designed as channels open toward the respective side walls and in which the flexible hoses fastened in the grooves can be received in each case when said flexible hoses have been filled with cooling fluid.

Dissipation of heat is thus possible not only via the rear side of the housing but also via the receiving rails and thus via the side walls of the thermally conductive plate. Furthermore, this gives rise to mechanical fixing if the hoses are filled with cooling fluid and expand into the channels.

On the cooling element, too, the flexible hose may be merely be fastened in the recess of said cooling element and, when filled with or flowed through by a cooling fluid, be situated almost entirely in the channel formed in the thermally conductive plate.

For this purpose, when no cooling fluid is flowing through the hose, said hose must be shrunken enough that it passes without problems into the channel in the thermally conductive plate through the opening of said channel as the circuit arrangement is inserted into the housing, and can then expand in said channel.

The invention will be described in greater detail below on the basis of exemplary embodiments with the aid of figures, in which.

Figure 1:
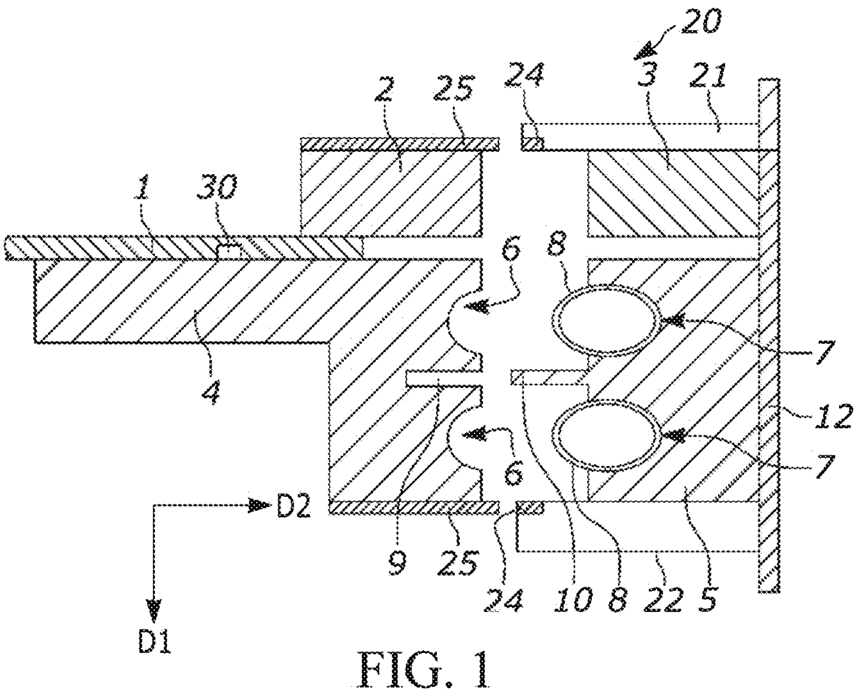
FIG. 1 shows a cross section through a circuit arrangement that has been inserted into a housing, with a first variant of the recesses.

FIG. 1 shows a first variant of an electronic device according to the invention having a circuit arrangement. The electronic device is shown schematically in a cross-sectional illustration in order to illustrate the arrangement of a flexible hose 8 between a cooling element 5 and a thermally conductive plate 4.

The circuit arrangement is formed with a circuit board 1, on which semiconductor components 30 are to be arranged, which semiconductor components may also be designed as power components and accordingly generate considerable heat. In a manner known per se, a thermally conductive plate 4 is arranged on the semiconductor components 30, to which thermally conductive plate the semiconductor components 30 can release their heat. Also arranged on the circuit board 1 is an electrical contact plug 2 that is intended to be connected to a counterpart contact plug 3 when the circuit arrangement is inserted into a housing 20. For this purpose, the housing 20 likewise has, in its rear wall, a further circuit board 12 to which the counterpart contact plug 3 is connected and which is in contact with energy and signal supply lines.

A cooling element 5 is arranged on the further circuit board 12, wherein the further circuit board 12 may form the rear wall of a housing 20 of the electrical device or is arranged on said rear wall. The cooling element 5 has a guide pin 10 which can engage into a recess 9 in the thermally conductive plate 4 in order to allow exact positioning of the thermally conductive plate 4 on the cooling element 5 when the circuit arrangement is inserted into the housing 20 of the electronic device in order for the circuit arrangement to be located and contacted there.

Figure 3:
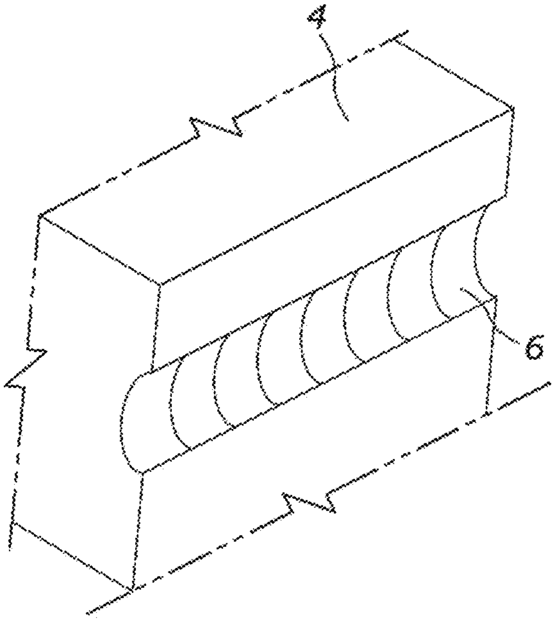
FIG. 3 shows a perspective view showing part of the housing of FIG. 1.

The thermally conductive plate 4 must be placed in good thermally conductive contact with the cooling element 5, for which purpose, according to the invention, the thermally conductive plate 4 has recesses 6, two of which are illustrated in FIG. 1. It is also possible in principle for only one recess, or a multiplicity of recesses, to be provided. The cooling element 5 correspondingly likewise has recesses 7, into which flexible hoses 8 are embedded, the protruding parts of which hoses are inserted into the recesses 6 of the thermally conductive plate 4 as the circuit arrangement is inserted into the housing 20 of the electronic device. FIG. 3 shows a perspective view showing part of the circuit arrangement of FIG. 1 illustrating the recesses 6 extending across the circuit arrangement. As shown in FIG. 1, a direction D1 in which the semiconductor component 30 is connected to the thermally conductive plate 4 is oriented perpendicular to the direction D2 in which the thermally conductive plate 4 is connected to the cooling element 5.

If a fluid, in particular a cooling liquid, is then introduced, in particular forced, into the flexible hoses 8, the flexible hoses 8 expand and press against the inner walls of the recesses 6, 7 both of the thermally conductive plate 4 and of the cooling element 5. Good heat transfer from the thermally conductive plate 4 to the cooling element 5 is thus made possible via the cooling liquid in the flexible hoses 8.

Figure 4:
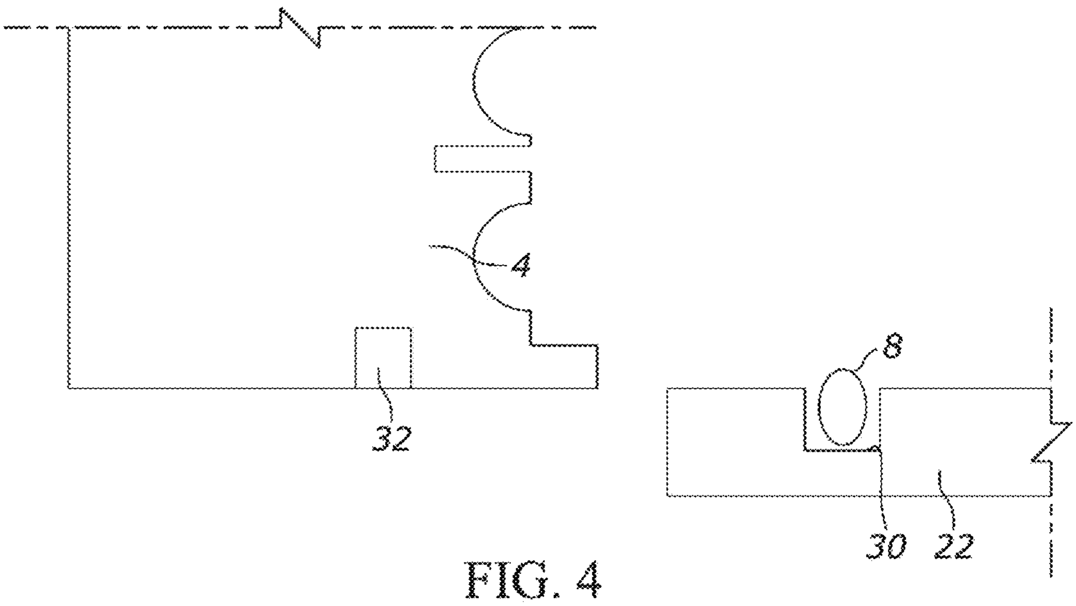
FIG. 4 shows a perspective view showing an alternative arrangement.

To prevent the thermally conductive plate 4 from being pushed away from the cooling element 5 again by the expanding flexible hoses 8, it is advantageous if the circuit arrangement is pushed with a fastening element into the housing 20 of the electronic device. FIG. 4 shows the receiving rail 22 has a groove 30 in which a flexible hose 8 is fastened, and the thermally conductive plate 4 has a recess 32 in which the flexible hose 8 fastened in the groove 30 can be received.

The housing 20 of the electronic device may in particular be a so-called rack in which a multiplicity of receiving rails 21 and 22 are arranged, into which multiple circuit boards can be inserted. Here, the receiving rails 21 and 22 may have grooves in which projections on cooling elements 4 are guided or into which the circuit board 1 itself engages. It would also be conceivable for the receiving rails to have projections that engage into grooves of the thermally conductive plate 4 in order to guide and hold the circuit arrangement in the housing 20.

Figure 2:
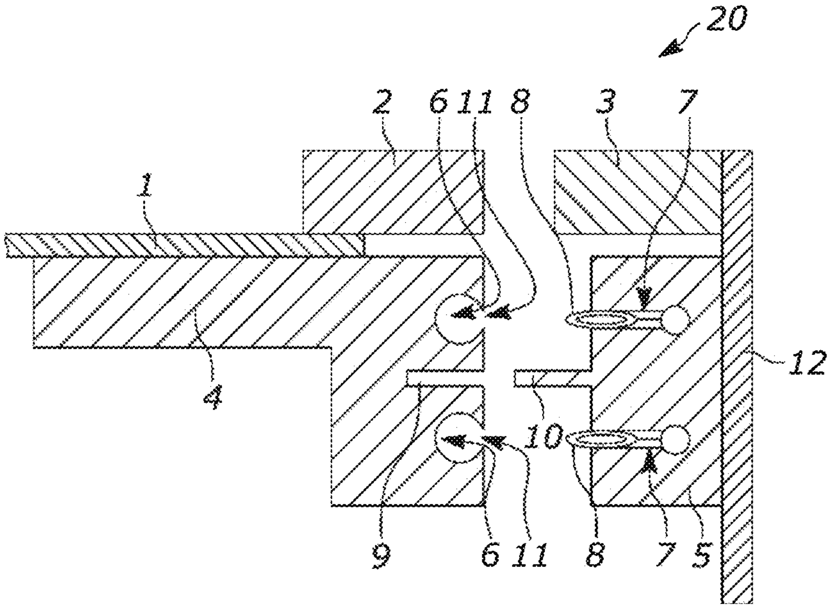
FIG. 2 shows a cross section through a circuit arrangement that has been inserted into a housing, with a second variant of the recesses.

FIG. 2 illustrates a second variant of an electronic device having a circuit arrangement, wherein identical parts are denoted by the same reference designations and will not be discussed once again.

By contrast to the variant in FIG. 1, the recesses 6 in the thermally conductive plate 4 are formed into the thermally conductive plate 4 to a greater depth, and are open to the outside only via openings 11 at the connecting surface of said thermally conductive plate, wherein said openings 11 have a width that is smaller than the mean diameter of the recesses 6, which in the example illustrated in FIG. 2 have a circular cross section.

In the exemplary embodiment illustrated in FIG. 2, the recesses 7 in the cooling element 5 are of elongate form and serve merely to receive and hold the shrunken flexible hoses 8 in this state. For this purpose, molded attachments on the flexible hoses 8 are fastened in the interior of the recesses 7.

The flexible hoses 8 are compressed such that, as the circuit arrangement is inserted into the housing 20 of the electronic device, said flexible hoses can readily pass through the openings 11 into the recesses 6 of the thermally conductive plate 4, wherein said flexible hoses then, when filled with a cooling fluid, expand and fill the entire recess 6 in the thermally conductive plate 4.

Mechanical fixing of the thermally conductive plate 4 to the cooling element 5 can also be achieved in this way, because the flexible hoses 8 that are fixed in the recesses 7 of the cooling element 5, and the expanded state of said flexible hoses in the recesses 6 in the thermally conductive plate 4, cause the thermally conductive plate 4 to be pulled in the direction of the cooling element 5.

The invention claimed is:

1. An electronic device, comprising:

a circuit arrangement comprising:

a circuit board with at least one heat-generating semiconductor component arranged thereon, and a thermally conductive plate which serves as a heat sink, is in thermally conductive contact with the at least one heat-generating semiconductor component and is arranged parallel to the circuit board, wherein the thermally conductive plate is configured to be placed in thermally conductive contact with a cooling element, and wherein at least one recess is provided in the thermally conductive plate on a connecting surface, provided for connecting to the cooling element, of the thermally conductive plate, said recess being configured to receive a part of a first flexible hose;

a housing with at least two receiving rails for receiving the circuit arrangement;

a contact apparatus for making contact with a counterpart contact apparatus arranged on the circuit board of the at least one circuit arrangement, wherein the contact apparatus is arranged between the at least two receiving rails such that the contact is made when the circuit arrangement is fully inserted into the housing between the at least two receiving rails; and a cooling element arranged between the at least two receiving rails such that contact is made between the connecting surface of the thermally conductive plate and the cooling element when the circuit arrangement is fully inserted into the housing between the at least two receiving rails, wherein the cooling element has, in a region of a connecting surface, at least one recess is provided on the cooling element, in which at least a portion of the first flexible hose is arranged, wherein the at least one recess of the thermally conductive plate extends from one side of the circuit arrangement to an opposite side, wherein the at least one recess of the thermally conductive plate is configured as a channel, a mean diameter of which is larger than an opening of the channel, said opening being situated in the connecting surface of the thermally conductive plate.

2. The electronic device as claimed in claim 1, wherein a cross section of the at least one recess of the thermally conductive plate is semicircular.

3. The electronic device as claimed in claim 1, wherein a cross section of the channel is circular.

4. The electronic device as claimed in claim 1, wherein a direction in which the at least one heat-generating semiconductor component is connected to the thermally conductive plate, the thermally conductive plate is oriented perpendicular to the direction in which the thermally conductive plate is connected to the cooling element, wherein the connecting surface of the thermally conductive plate, provided for connecting to the cooling element, is oriented perpendicular to a surface of the circuit board.

5. The electronic device as claimed in claim 1, wherein the connecting surface of the cooling element and the connecting surface of the thermally conductive plate have a congruent profile.

6. The electronic device as claimed claim 5, wherein the at least one recess of the thermally conductive plate extends from one side of the circuit arrangement to the opposite side and is configured as a channel, a mean diameter of which is larger than an opening of the channel, said opening being situated in the connecting surface of the thermally conductive plate, and wherein the first flexible hose is merely fastened in the recess of the cooling element and, when filled with or flowed through by a cooling fluid, is situated almost entirely in the channel formed in the thermally conductive plate.

7. The electronic device as claimed in claim 6, wherein a cross section of the channel is circular.

8. The electronic device as claimed in claim 6, wherein a direction in which the at least one heat-generating semiconductor component is connected to the thermally conductive plate is oriented perpendicular to the direction in which the thermally conductive plate is connected to the cooling element, wherein a connecting surface, provided for connecting to the cooling element, of the thermally conductive plate is oriented perpendicular to a surface of the circuit board.

9. The electronic device as claimed in claim 1, wherein the at least two receiving rails have grooves and the thermally conductive plate has, on opposite side walls, projections matching the grooves, or vice versa, and wherein the at least two receiving rails have grooves in which a second flexible hose is fastened, and the thermally conductive plate has, on opposite side walls, recesses which are configured as channels open toward the respective side walls and in which the second flexible hose fastened in the grooves can be received in each case when the second flexible hose has been filled with cooling fluid.

10. The electronic device as claimed in claim 9, wherein the second flexible hose is fastened in the recess of the cooling element and, when filled with or flowed through by a cooling fluid, is situated almost entirely in the channel formed in the thermally conductive plate.

11. An electronic device, comprising:

a circuit arrangement comprising:

a circuit board with at least one heat-generating semiconductor component arranged thereon, and a thermally conductive plate which serves as a heat sink, is in thermally conductive contact with the at least one heat-generating semiconductor component and is arranged parallel to the circuit board, wherein the thermally conductive plate is configured to be placed in thermally conductive contact with a cooling element, and wherein at least one recess is provided in the thermally conductive plate on a connecting surface, provided for connecting to the cooling element, of the thermally conductive plate, said recess being configured to receive a part of a first flexible hose;

a housing with at least two receiving rails for receiving the circuit arrangement;

a contact apparatus for making contact with a counterpart contact apparatus arranged on the circuit board of the at least one circuit arrangement, wherein the contact apparatus is arranged between the at least two receiving rails such that the contact is made when the circuit arrangement is fully inserted into the housing between the at least two receiving rails; and a cooling element arranged between the at least two receiving rails such that contact is made between the connecting surface of the thermally conductive plate and the cooling element when the circuit arrangement is fully inserted into the housing between the at least two receiving rails, wherein the cooling element has, in a region of a connecting surface, at least one recess is provided on the cooling element, in which at least a portion of the first flexible hose is arranged, wherein the at least two receiving rails have grooves and the thermally conductive plate has, on opposite side walls, projections matching the grooves, or vice versa.

12. The electronic device as claimed claim 11, wherein the at least one recess of the thermally conductive plate extends from one side of the circuit arrangement to the opposite side and is configured as a channel, a mean diameter of which is larger than an opening of the channel, said opening being situated in the connecting surface of the thermally conductive plate, and wherein the first flexible hose is merely fastened in the recess of the cooling element and, when filled with or flowed through by a cooling fluid, is situated almost entirely in the channel formed in the thermally conductive plate.

13. The electronic device as claimed in claim 12, wherein a cross section of the channel is circular.

14. The electronic device as claimed in claim 12, wherein a direction in which the at least one heat-generating semiconductor component is connected to the thermally conductive plate is oriented perpendicular to the direction in which the thermally conductive plate is connected to the cooling element, wherein a connecting surface, provided for connecting to the cooling element, of the thermally conductive plate is oriented perpendicular to a surface of the circuit board.

15. The electronic device as claimed claim 11, wherein the at least one recess of the thermally conductive plate extends from one side of the circuit arrangement to the opposite side and is configured as a channel, a mean diameter of which is larger than an opening of the channel, said opening being situated in the connecting surface of the thermally conductive plate, and wherein the first flexible hose is merely fastened in the recess of the cooling element and, when filled with or flowed through by a cooling fluid, is situated almost entirely in the channel formed in the thermally conductive plate.

16. The electronic device as claimed in claim 15, wherein a cross section of the channel is circular.

17. The electronic device as claimed in claim 15, wherein a direction in which the at least one heat-generating semiconductor component is connected to the thermally conductive plate is oriented perpendicular to the direction in which the thermally conductive plate is connected to the cooling element, wherein a connecting surface of the thermally conductive plate, provided for connecting to the cooling element, of the thermally conductive plate is oriented perpendicular to a surface of the circuit board.

18. An electronic device, comprising:

a circuit arrangement comprising:

a circuit board with at least one heat-generating semiconductor component arranged thereon, and a thermally conductive plate which serves as a heat sink, is in thermally conductive contact with the at least one heat-generating semiconductor component and is arranged parallel to the circuit board, wherein the thermally conductive plate is configured to be placed in thermally conductive contact with a cooling element, and wherein at least one recess is provided in the thermally conductive plate on a connecting surface, provided for connecting to the cooling element, of the thermally conductive plate, said recess being configured to receive a part of a first flexible hose;

a housing with at least two receiving rails for receiving the circuit arrangement;

a contact apparatus for making contact with a counterpart contact apparatus arranged on the circuit board of the at least one circuit arrangement, wherein the contact apparatus is arranged between the at least two receiving rails such that the contact is made when the circuit arrangement is fully inserted into the housing between the at least two receiving rails; and a cooling element arranged between the at least two receiving rails such that contact is made between the connecting surface of the thermally conductive plate and the cooling element when the circuit arrangement is fully inserted into the housing between the at least two receiving rails, wherein the cooling element has, in a region of a connecting surface, at least one recess is provided on the cooling element, in which at least a portion of the first flexible hose is arranged, wherein the at least two receiving rails have grooves in which a second flexible hose is fastened, and the thermally conductive plate has, on opposite side walls, recesses which are configured as channels open toward the respective side walls and in which the second flexible hose fastened in the grooves can be received in each case when the second flexible hose has been filled with cooling fluid.

* * * * *